(12) United States Patent
Lowry

(10) Patent No.: US 7,166,186 B2
(45) Date of Patent: Jan. 23, 2007

(54) LASER DECAPSULATION APPARATUS AND METHOD

(75) Inventor: Robert K. Lowry, Melbourne Beach, FL (US)

(73) Assignee: Intersil Americas Inc., Milpitas, CA (US)

( * ) Notice: Subject to any disclaimer, the term of this patent is extended or adjusted under 35 U.S.C. 154(b) by 1103 days.

(21) Appl. No.: 09/949,736

(22) Filed: Sep. 10, 2001

(65) Prior Publication Data

US 2002/0025600 A1   Feb. 28, 2002

Related U.S. Application Data

(62) Division of application No. 09/307,896, filed on May 10, 1999, now Pat. No. 6,335,208.

(51) Int. Cl.
| | |
|---|---|
| C23F 1/00 | (2006.01) |
| H01L 21/306 | (2006.01) |
| B23K 26/08 | (2006.01) |
| B23K 26/02 | (2006.01) |
| B23K 26/03 | (2006.01) |
| H01L 39/24 | (2006.01) |
| B44C 1/22 | (2006.01) |
| C03C 15/00 | (2006.01) |

(52) U.S. Cl. .............. 156/345.5; 219/121.66; 505/410; 216/94

(58) Field of Classification Search ............... 117/108, 117/843, 904, 906; 118/50.1, 726; 134/1, 134/18, 902; 148/511, 512, 525, DIG. 60, 148/DIG. 65, DIG. 7, DIG. 72, DIG. 90, 148/DIG. 93; 204/192.13; 216/25, 65, 94; 219/121.13, 121.17, 121.6, 121.61, 121.62, 219/121.63, 121.64, 121.65–121.86; 156/345.5; 505/410

See application file for complete search history.

(56) References Cited

U.S. PATENT DOCUMENTS 4,052,603 A * 10/1977 Karlson ................ 700/192

(Continued)

FOREIGN PATENT DOCUMENTS

FR   2 731 637   3/1995

(Continued)

*Primary Examiner*—Rudy Zervigon
(74) *Attorney, Agent, or Firm*—Fogg and Associates LLC; Scott V. Lundberg

(57) ABSTRACT

A decapsulation apparatus 100 has a laser 8 that removes plastic encapsulant from a device 24. Chamber 20 is sealed. Exhaust port 9 removes debris and fumes. The device 24 is positioned and scanned using an X,Y table 2. A hinged end 4 rotates the device to an acute angle of incidence with respect to a laser 8. Endpoint detector 10 senses the exposed integrated circuit and moves or shuts down the laser 8.

1 Claim, 2 Drawing Sheets

U.S. PATENT DOCUMENTS

| | | | | |
|---|---|---|---|---|
| 5,049,406 A | * | 9/1991 | Geittner et al. | 427/575 |
| 5,182,230 A | | 1/1993 | Donelson et al. | 204/157.47 |
| 5,254,832 A | * | 10/1993 | Gartner et al. | 219/121.69 |
| 5,281,798 A | * | 1/1994 | Hamm et al. | 219/121.62 |
| 5,424,254 A | | 6/1995 | Damiot | 438/123 |
| 5,643,472 A | | 7/1997 | Engelsberg et al. | 134/1 |
| 5,700,697 A | | 12/1997 | Dlugokecki | 438/115 |
| 5,725,914 A | * | 3/1998 | Opower | 204/192.1 |
| 5,736,464 A | * | 4/1998 | Opower | 148/DIG. 93 |
| 5,817,243 A | | 10/1998 | Shaffer | 216/54 |
| 5,824,569 A | | 10/1998 | Brooks et al. | 438/118 |
| 6,048,588 A | | 4/2000 | Engelsberg | 134/1 |
| 6,140,604 A | * | 10/2000 | Somers et al. | 219/121.7 |
| 6,329,272 B1 | * | 12/2001 | Gagnon et al. | 438/545 |

FOREIGN PATENT DOCUMENTS

| | | |
|---|---|---|
| GB | 2 177 965 A | 2/1987 |
| WO | WO 86/07492 | 12/1986 |

* cited by examiner

LASER DECAPSULATION APPARATUS AND METHOD

CROSS-REFERENCE TO RELATED APPLICATIONS

This application is a divisional application of U.S. patent application Ser. No.: 09/307,896, filed May 10, 1999 now U.S. Pat. No. 6,335,208.

BACKGROUND OF THE INVENTION

This invention relates generally to an apparatus and method for removing plastic compounds that encapsulate integrated circuits, and, in particular, to a laser equipped apparatus and method for decapsulating plastic encapsulated integrated circuits.

The vast majority of integrated circuits are packaged in plastic resins including but not limited to biphenyl, ortho-cresol novolac, and dicyclopentadienyl types. The plastic package seals the enclosed integrated circuit from the external environment, including moisture and dust. The resin contains fillers such as silica or other insulating materials to enhance the physical and mechanical properties of the package. The integrated circuits are encapsulated using a transfer molding process. During that process a solid charge of resin is melted and then forced under pressure into a multi cavity mold that contains a number of integrated circuits. One mold may contain tens or hundreds of integrated circuits. The size of the molded integrated circuits varies in length, width and height. Some devices using the standard dual-in-line package are several millimeters thick. Other small outline packages are a millimeter in thickness.

There are a number of reasons for removing the plastic encapsulant from finished Integrated circuits. One reason is to monitor the manufacturing process. In most mass manufacturing processes, samples of finished product are often taken and analyzed to check whether or not the finished product is made to the manufacturing specifications. Some times one or more devices fail, it is desirable to analyze those failed devices to detect process flaws so that the flaws can be corrected. Some devices are also reverse engineered in order to discover how the device is constructed.

Current techniques for removing the plastic are time consuming and environmentally unfriendly. One technique uses fuming nitric or sulfuric acid. That technique can take several hours or more in some cases to remove the plastic, and the spent chemicals must be properly disposed of In addition, these harsh chemicals come in contact with the surface of the integrated chip being exposed, which may chemically remove foreign substances or contaminants residing between the top of the die and the mold compound which will subsequently not be detected in failure analysis. Plasma etching may be used but it is slow and also leaves undesired residues. As such, there is a long felt and unfulfilled need for a faster process that is environmentally friendly and less disruptive to the top surface of the integrated circuit chip.

SUMMARY

The invention eliminates the hazardous waste and provides a faster decapsulation process which is less disruptive to the top-of-die surface. The invention provides an apparatus and method for removing plastic encapsulant using a tunable laser. A chamber has a stage for holding the integrated circuit during decapsulation. The stage is an X,Y table that comprises rods so that debris from the removed encapsulant may fall between the rods. Below the stage is a dust bin for collecting the debris. A hinge on the table lets the operator adjust the angle of incidence of the laser beam on the specimen surface.

A laser outside the chamber shines its beam through a window or other suitable optical opening onto the surface of the device under test. The laser beam is tunable in frequency and amplitude to suitable settings for removing the encapsulant. The laser beam is generated by a YAG or infrared laser or any other laser suitable for breaking the cross linked bonds of the encapsulant without damaging the integrated circuit.

The decapsulation process is controlled by a computer that includes a microprocessor or digital signal processor, suitable memory, an application program for operating the apparatus and suitable sensors. One sensor is an endpoint detector. It is focused on the integrated circuit to detect reflected light. Where the plastic is removed, the beam strikes the integrated circuit and the amplitude and frequency of the reflected light changes. The endpoint detector senses those changes. In response to a signal indicating that the integrated circuit is exposed, the computer shuts down the laser beam or moves the laser beam to a new location.

The apparatus has a sealed chamber. Fumes generated by decapsulation are exhausted through a suitable fan or blower-operated exhaust port. A cleaning gas such as nitrogen or compressed air is directed at the surface of the integrated circuit to remove dust. The removed dust is either exhausted of falls to into the dust bin.

DRAWINGS

DETAILED DESCRIPTION

Figure 1:
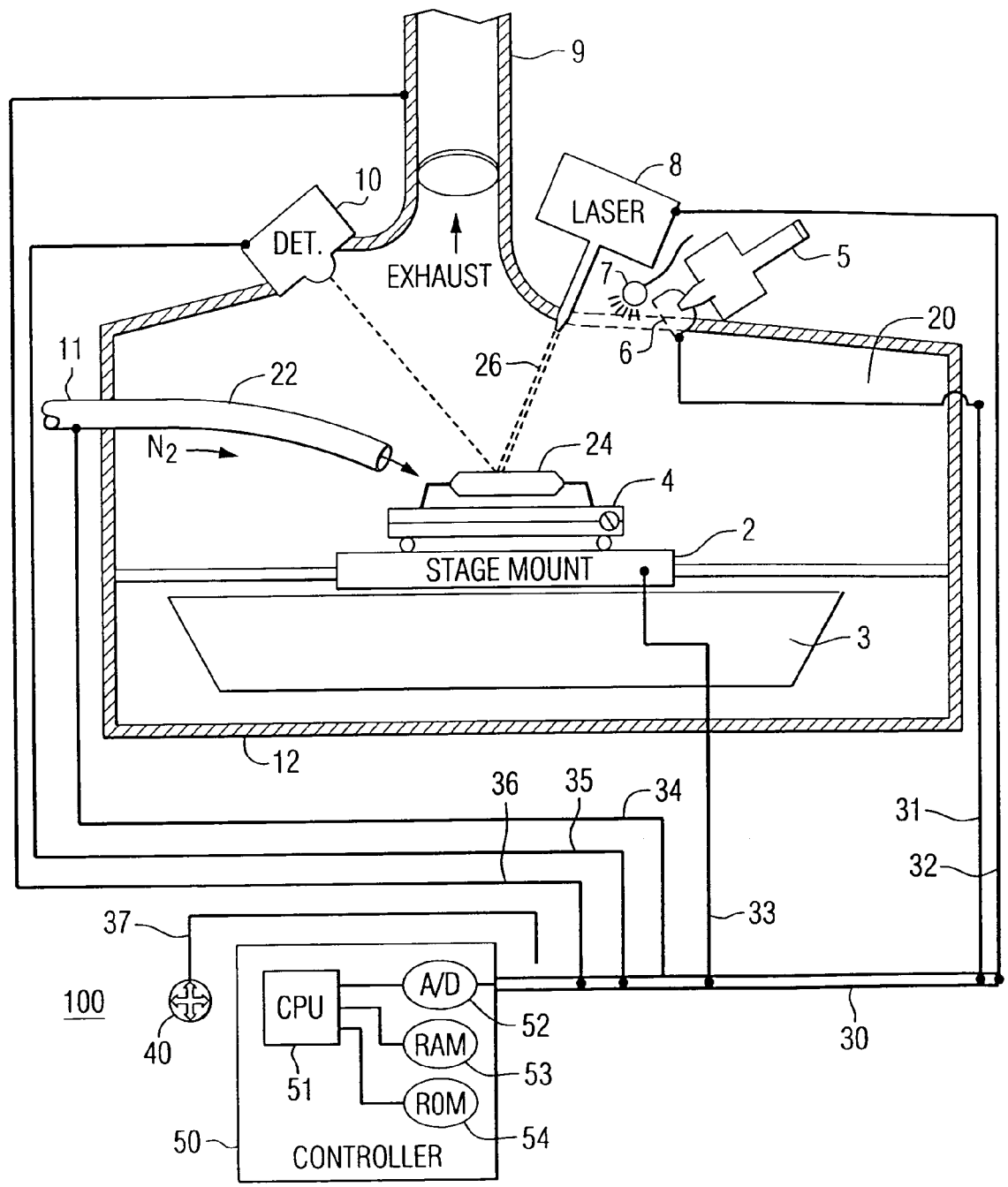
FIG. 1 is a sectional elevation view of the invention showing the integrated circuit oriented at a near normal angle to the laser beam.

Turning to FIG. 1, there is shown a decapsulation apparatus 100 that comprises a chamber wall 12 that encloses and seals a chamber 20. The chamber 12 has a clean gas inlet 11 that includes a conduit 22 that directs a stream of clean gas, such as nitrogen or compressed air at a device under test (DUT), i.e., integrated circuit 24. Chamber 12 also has an exhaust port 9 for removing fumes and dust particles from the chamber. Within the chamber is a stage 2 that is disposed over a dust bin 3. The dust bin 3 catches large particles that are removed from the DUT 24.

A laser 8 is mounted on the outside wall of the chamber 20 and it directs a laser beam 26 toward the DUT 24. The laser is any suitable laser, such as a YAG or an infrared laser. The laser has its frequency and its amplitude tunable for removing plastic encapsulant from the DUT 24 without causing damage to the encapsulated integrated circuit. The laser beam 26 passes through an optical opening or window (not shown) in the wall of the chamber 12. The interior of the chamber 20 is illuminated by a suitable light 7. Operation of the laser on the DUT 24 is observed through a microscope 5. A microscope 5 has a shutter 6 that may be manually or automatically operated as hereinafter described. Light reflected from the surface of the DUT 24 is detected by endpoint detector 10. The endpoint detector 10 senses the amplitude or frequency or both of the reflected light.

Figure 2:
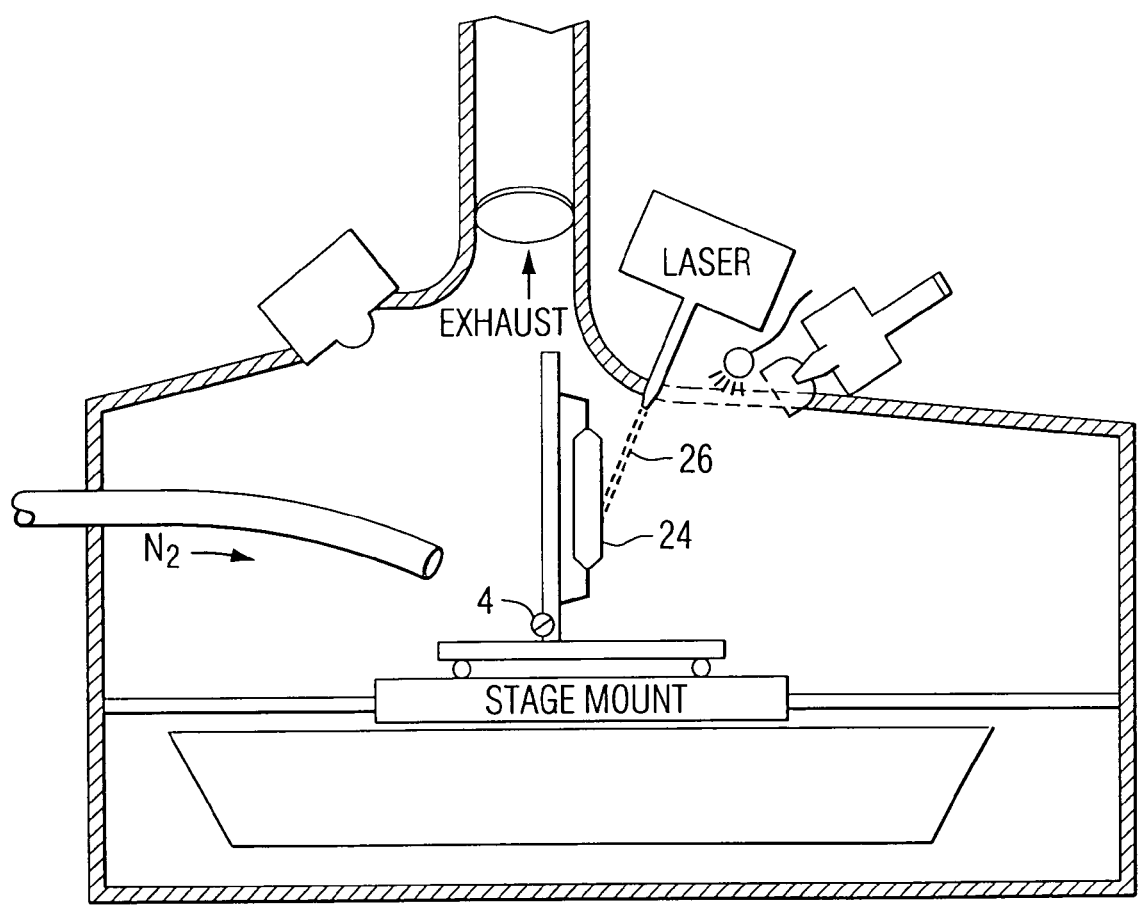
FIG. 2 is a further view showing the integrated circuit oriented at an acute angle of incidence to the laser beam.

The stage 2 is an X,Y positioning table. It is desirable that the stage be made of rods or has a perforated table so that dust and debris removed from the DUT 24 may fall through the stage and the stage mount into the dust bin 3. Such X,Y positioning tables are well known in the art. They may be operated using piezoelectric operators, linear magnetic motors, or lead screws. As shown in FIG. 1, the DUT 24 is disposed at substantially a normal angle to the laser beam 26. The stage is hinged at one end 4 so that the DUT 24 may be rotated to a substantially vertical position as shown in FIG. 2. In its vertical position, the laser beam 26 has an acute angle of incidence on the surface of the DUT 24. That particular position is useful when it is desired to leave a thin layer of encapsulant on the surface of the integrated circuit. Leaving such a thin layer is often desired during failure analysis to detect contaminants on the surface of the encapsulated DUT 24.

The apparatus 100 may be manually operated or automatically operated or may be semiautomatically operated. For automatic and semiautomatic operation, the apparatus 100 is provided with a controller 50. The controller 50 includes a CPU 51 which may be a microprocessor or a digital signal processor. The CPU 51 communicates with a random access memory 53 and a read-only memory 54. Suitable operating software applications and application software are stored in the RAM 53 or ROM 54. The CPU 51 controls operations of the various components of the apparatus 100 via the control bus 30 and the control lines 31–36 that are respectively connected to the microscope shutter 6, laser 8, stage 2, clean gas inlet 11, endpoint detector 10, and the exhaust port 9. By manual, automatic or semiautomatic operation, the operator may selectively operate any one of the controlled components, move the stage to its desired X,Y position, and rotate the top platform of the stage to its desired Z axis orientation.

The following wavenumbers in the infrared range are especially applicable: 725–900 cm-1, 1150–1300 cm-1, 1400–1500 cm-1 and 1600–1750 cm-1. These wavenumber ranges were determined from IR chemical analysis of the mold compound resins. A reference if appropriate is "Identifying Plastic Encapsulant Materials by Pyrolysis Infrared Spectrophotometry", R.K. Lowery, K.L. Hanley, Proceedings, 1998 Intl Symposium for Testing and Failure Analysis, Nov. 1998, pp. 399–401. It is these wavenumber ranges in particular where there are is significant absorption of IR energy at the molecular level by plastic resins. An incident beam tuned for maximized power in these energy ranges would begin to promote molecular rearrangement and ultimately decompositional breakdown of polymerized resin molecules. Any tuned laser operating in these ranges would promote breakdown not just by thermal heating the material (which almost any incident laser energy with enough power could provide) but also by chemical decomposition. This promotes breakdown in a "material-specific" way, so that excessive heating via straightforward but less-controllable thermal decomposition can be avoided.

In operation, a DUT 24 is placed or otherwise mounted on the top of the stage 2. While the embodiment shown in FIG. 1 includes only a single device, those skilled in the art will appreciate that multiple devices may be mounted on the stage. Either manually or with the assistance of controller 50, the stage 2 is positioned in an X,Y plane relative to the laser beam 26. of laser 8. Laser 8 is under control of the controller 50. Laser 8 may be any suitable laser that has its amplitude and frequency tuned and controlled by controller 50. Such suitable lasers include YAG lasers, as well as infrared lasers. It is desired to use a laser with a suitable power and frequency for breaking the cross-linked polymeric bonds of the plastic resin that encapsulates the DUT 24. The laser may be operated at a relatively low level to provide a beam that strikes the stage. The operator may then position the stage by using a joy stick device 40 and the microscope 5. In the preferred embodiment, the stage is moved to initially focus the laser or one of the corners of the DUT 24. Once the starting point for the laser has been selected, then the stage moves in a raster pattern along a first axis, steps transverse to the first axis at least the width of the beam, and then reverses direction and travels back along the first axis. In this manner, the beam 26 raster-scans across the DUT 24. Of course, if desired, the laser beam 26 may be raster-scanned using optical methods, including prisms and/or mirrors that are selectively moved to sweep the beam across the surface of the DUT 24.

When the beam 26 is operated at its effective frequency and amplitude, the plastic encapsulant is removed from the DUT 24. The removal process creates a cloud of debris and fumes. The fumes and some of the debris are withdrawn from the chamber 20 via the exhaust port 9. The heavier debris particles fall through the rods or holes in the stage 2 and are captured in the dust bin 3. Some of the dust may settle onto the DUT 24. Clean gas 22 drives the dust away from the DUT 24. The clean gas 22 includes any suitable gas, such as nitrogen or air for dispersing the dust particles away from the surface of the DUT 24. Such dispersal permits the operator to view the DUT in process and removes particles from the immediate path of the laser so that the DUT 24 has its encapsulant more effectively removed.

Decapsulation may be carried out automatically. During automatic decapsulation, the laser is operated until the endpoint detector 10 detects a change in the amplitude and/or frequency of light reflected from the DUT 24. When the integrated circuit is uncovered, the reflected light changes its frequency. The amount of reflected light may also change. The DUT detects these changes and provides a signal via signal and control line 35 to the controller 50.

Controller 50 receives and sends signals on control and sensor bus 30 via an A to D and D to A converter 52. As is often the case, the control and sensing signals are analog signals. Thus, it is necessary to convert the analog signals to digital signals so that they can be understood by the CPU 51. If the CPU 51 is a DSP, the DSP has a built-in A to D and D to A converter.

Controller 50 receives the signal from the endpoint detector 10. When the endpoint detector 10 signals that the integrated circuit is uncovered, the controller 50 advances the stage to the next position to continue removing encapsulant. As such, for a given beam width, the laser is focused on the DUT 24 until the underlying integrated circuit is exposed. Upon detection of the exposed integrated circuit, the stage is moved in a continuous or stepwise pattern to subsequent positions.

As indicated above, it is also possible to manually operate the apparatus or to semi-automatically operate the apparatus. For example, it is often desired to provide one or more pinholes down to the surface of the integrated circuit. Those holes can be provided by selectively removing encapsulant using the laser and the endpoint detector.

Having thus described the preferred embodiment of the invention, those skilled in the art will appreciate that further changes, modifications, additions and omissions may be made to that embodiment without departing from the spirit and scope of the appended claims.

The invention claimed is:

1. An apparatus for removing encapsulant from a devise under test (DUT), the apparatus comprising: a chamber having an optical opening, a dispersion fluid inlet and an exhaust outlet, the optical opening adapted to allow a laser to direct a laser beam on a surface of the DUT for removing portions of the encapsulant; a stage in the chamber adapted to receive and hold the DUT, the stage comprising a perforated table to allow debris from the removed portions of the encapsulant to fall through the table into a dust bin in the chamber, the dust bin adapted to collect debris from the removed portions of the encapsulant.

* * * * *